(12) United States Patent
Horning et al.

(10) Patent No.: US 6,888,233 B2
(45) Date of Patent: May 3, 2005

(54) SYSTEMS FOR BURIED ELECTRICAL FEEDTHROUGHS IN A GLASS-SILICON MEMS PROCESS

(75) Inventors: Robert D. Horning, Savage, MN (US); Jeffrey A. Ridley, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 32 days.

(21) Appl. No.: 10/385,181

(22) Filed: Mar. 10, 2003

(65) Prior Publication Data

US 2004/0180464 A1 Sep. 16, 2004

(51) Int. Cl.[7] .............................................. H01L 21/00
(52) U.S. Cl. ....................... 257/684; 257/690; 257/693; 257/698
(58) Field of Search .................................. 257/674–698

(56) References Cited

U.S. PATENT DOCUMENTS

| | | |
|---|---|---|
| 5,338,416 A | 8/1994 | Mlcak et al. |
| 5,437,739 A | 8/1995 | Hays |
| 5,492,596 A | 2/1996 | Cho |
| 5,509,974 A | 4/1996 | Hays |
| 5,511,428 A | 4/1996 | Goldberg et al. |
| 5,637,189 A | 6/1997 | Peeters et al. |
| 5,837,562 A | 11/1998 | Cho |
| 5,843,832 A | 12/1998 | Farmer et al. |
| 5,854,122 A | 12/1998 | Hays et al. |
| 5,866,469 A | 2/1999 | Hays |
| 6,143,583 A | 11/2000 | Hays |
| 6,210,988 B1 | 4/2001 | Howe et al. |
| 6,245,161 B1 | 6/2001 | Henley et al. |
| 6,271,101 B1 | 8/2001 | Fukunaga |
| 6,277,666 B1 | 8/2001 | Hays et al. |
| 6,287,941 B1 | 9/2001 | Kang et al. |
| 6,337,027 B1 | 1/2002 | Humphrey |
| 6,428,713 B1 | 8/2002 | Christenson et al. |
| 6,433,401 B1 | 8/2002 | Clark et al. |
| 6,440,766 B1 | 8/2002 | Clark |
| 6,444,138 B1 | 9/2002 | Moon et al. |
| 6,448,622 B1 | 9/2002 | Franke et al. |
| 6,452,238 B1 * | 9/2002 | Orcutt et al. ............... 257/415 |

FOREIGN PATENT DOCUMENTS

| | | |
|---|---|---|
| EP | 1 167 281 A | 1/2002 |
| WO | WO 02/068320 | 9/2002 |

OTHER PUBLICATIONS

International Search Report dated Jul. 16, 2004, Application No. PCT/US03/US20004/007277; 10 pages.

* cited by examiner

Primary Examiner—H. Jey Tsai
(74) Attorney, Agent, or Firm—Matthew Luxton, Esq.; Armstrong Teasdale LLP (57) ABSTRACT

A method for providing conductive paths into a hermetically sealed cavity is described. The sealed cavity is formed utilizing a silicon-glass micro-electromechanical structure (MEMS) process and the method includes forming recesses on a glass substrate everywhere that a conductive path is to pass into the cavity, and forming conductive leads in and around the recesses. A glass layer is deposited over the substrate, into the recesses, and over the conductive leads and then planarized to expose portions of the conductive leads. A sealing surface is formed on at least a portion of the glass layer. Silicon is then bonded to the sealing surface of the planarized glass layer, the wafer being configured such that a portion of each lead is within the sealed cavity and a portion of each lead is outside the sealed cavity.

11 Claims, 8 Drawing Sheets

SYSTEMS FOR BURIED ELECTRICAL FEEDTHROUGHS IN A GLASS-SILICON MEMS PROCESS

BACKGROUND OF THE INVENTION

This invention relates generally to micro-electromechanical structures (MEMS) processes, and more specifically to electrical connections from the inside to the outside of a sealed cavity formed in MEMS processes.

One method of producing micro-electromechanical structures (MEMS) is by bonding a patterned silicon wafer to a glass (usually pyrex) substrate. Portions of the silicon wafer are etched away, leaving a mechanical silicon structure anchored to the glass substrate. The process is initiated with a glass wafer. A cavity is formed in the wafer using a wet or dry etching process. A depth of the etch determines a separation between the structure's capacitive elements. Metal layers are deposited and patterned on the glass, forming conductive electrodes and interconnects. A heavily boron doped (p++) epitaxial layer is grown on a separate, lightly doped silicon substrate. A pattern is etched into the silicon wafer to a depth greater than the thickness of the epitaxial layer. The glass and silicon wafers are bonded together using anodic bonding. Using an etchant that etches lightly doped silicon but not p++ silicon, the undoped portion of the silicon substrate is etched away, leaving the freestanding microstructures. Such a process is generally referred to herein as a silicon-glass MEMS process.

The mechanical structures are exposed to the ambient environment during operation. Therefore, if the mechanism requires a special operating environment, or simply protection from the ambient environment, the protection must be done at a packaging step.

One packaging step is to form the mechanical structures in the silicon-glass MEMS process within hermetically sealed cavities. One known method for forming such cavities is to bond a silicon structure, containing a recess, to the glass wafer. The recessed portion, which does not extend all the way through the p++ silicon layer, forms the cavity after bonding. Unfortunately, using this method it is difficult to make a silicon structure, for example, a vibrating sensor, that is completely enclosed by the cavity but not connected to the cavity walls.

Another method is to bond a second glass wafer, containing recesses, on top of the previously fabricated glass/Si wafer. At least part of the silicon structure is a continuous seal ring that completely surrounds, but is not connected to, a second silicon structure (i.e. the vibrating sensor). The second glass wafer is bonded to the seal ring, but not to the second silicon structure, forming the cavity.

However, it is desirable to have electrical leads extending from outside the cavities into the hermetically sealed cavities, without breaking the seal. A seal is much more difficult to attain since formation of the electrical leads form uneven topography on the glass substrate surface. Small gaps occur where the leads are formed on the substrate. The gaps result in an uneven sealing surface and result in unbonded areas which break the hermetic seal. Anodic bonding is one method that has been used in an attempt to alleviate this problem. However, anodic bonding can only be accomplished over uneven areas that fluctuate by about 200 angstroms or less, and a long term leak rate for anodic bonding seals is unknown. Therefore, in order to have leads that extend through a reliable hermetic seal, a topography used in making the seal should be substantially flat.

BRIEF SUMMARY OF THE INVENTION

In one aspect, a method for providing conductive paths into a hermetically sealed cavity, the sealed cavity formed utilizing a silicon-glass MEMS process, is provided. The method comprises forming recesses on a surface of a glass substrate at locations where a conductive path is to pass into the cavity and forming conductive leads in and around the recesses. A glass layer is then deposited over the substrate, into the recesses, and over the conductive leads. The deposited glass layer is planarized to a level which exposes portions of the conductive leads. A sealing surface is formed on at least a portion of the glass layer and silicon is bonded to the sealing surface of the planarized glass layer. The silicon is positioned such that a portion of each lead is within the sealed cavity and a portion of each lead is outside the sealed cavity.

In another aspect, a structure having a hermetically sealed cavity therein is provided. The structure has at least one electrically conductive path passing from outside of the sealed cavity to inside the sealed cavity. The structure comprises a glass substrate comprising recesses where electrical signals are to pass into the sealed cavity and conductive leads are formed in and around the recesses. The structure further comprises a glass layer deposited over the substrate, and further deposited over the recesses and the conductive leads. The glass layer is planarized to a level of a portion of the conductive leads around the recesses. Silicon is bonded to the planarized glass surface to form a cavity. The silicon is fabricated such that a portion of each conductive lead is within the sealed cavity and a portion of each conductive lead is outside the sealed cavity.

In still another aspect, a micro electromechanical system (MEMS) gyroscope is provided which comprises a housing, gyroscope electronics located within the housing, a structure defining a hermetically sealed cavity within the housing, and a tuning fork gyroscope located within the hermetically sealed cavity. The structure comprises a plurality of electrical feedthroughs providing electrical connections between the gyroscope electronics and the tuning fork gyroscope, and a glass substrate comprising recesses where the electrical feedthroughs pass into and out of the hermetically sealed cavity. The structure also comprises a glass layer deposited over the substrate and the electrical feedthroughs in the recesses. The glass layer is planarized to a level of a portion of the electrical feedthroughs around the recesses and silicon is bonded to the planarized glass layer. The silicon is fabricated such that a portion of each electrical feedthrough is within the hermetically sealed cavity and a portion of each electrical feedthrough is outside the hermetically sealed cavity.

In yet another aspect, a method for providing electrical connections between a tuning fork gyroscope and gyroscope electronics is provided. The tuning fork gyroscope to be located within a hermetically sealed cavity, and the method comprises forming recesses on a glass substrate anywhere that an electrical path is to pass into the cavity and depositing electrical leads in and around the recesses. A glass layer is deposited over the substrate, into the recesses, and over the leads. The deposited glass layer is planarized to a level of the portion of the leads around the recesses, exposing a first contact and a second contact for each lead. The tuning fork gyroscope is placed in contact with the first contacts for the leads, and the gyroscope electronics are connected to the second contacts for each lead.

In another aspect, a method for providing conductive paths into a hermetically sealed cavity formed utilizing a silicon-glass micro-electromechanical structure (MEMS) process is provided. The method comprises forming recesses on a glass substrate where conductive paths are to pass into the cavity, forming leads on the recesses, which extend out of the recesses, depositing a glass deposit on the conductive leads which fills the recesses, and leaves ends of the leads exposed, planarizing the glass deposit to a level of an upper surface of the substrate, where the hermetic seal is to be formed, and bonding a silicon wafer to the planarized glass deposit and the upper surface of the substrate. The wafer is positioned such that a portion of each lead is within the sealed cavity and a portion of each lead is outside the sealed cavity.

In a still further aspect, a structure having a hermetically sealed cavity therein, and having at least one electrically conductive path passing from outside of the cavity to the sealed cavity is provided. The structure comprises a glass substrate comprising recesses where electrical signals are to pass into the sealed cavity and an upper surface, conductive leads deposited on the recesses, and a glass deposit on the conductive leads. The glass deposit comprises an upper surface planarized to a level of the upper surface of the substrate. The structure also comprises silicon bonded to the upper surface of the glass deposit and the upper surface of the substrate. The silicon is fabricated such that a portion of each conductive lead is within the sealed cavity and a portion of each conductive lead is outside the sealed cavity.

In yet still a further aspect, a method for providing electrical connections between components is provided. The method comprises forming recesses on a glass substrate where the electrical connections are to be made, depositing conductive leads within the recesses, which extend out of the recesses, forming a glass deposit on the conductive leads which fills the recesses, and exposing portions of the conductive leads for electrical connection.

DETAILED DESCRIPTION OF THE INVENTION

Figure 1:
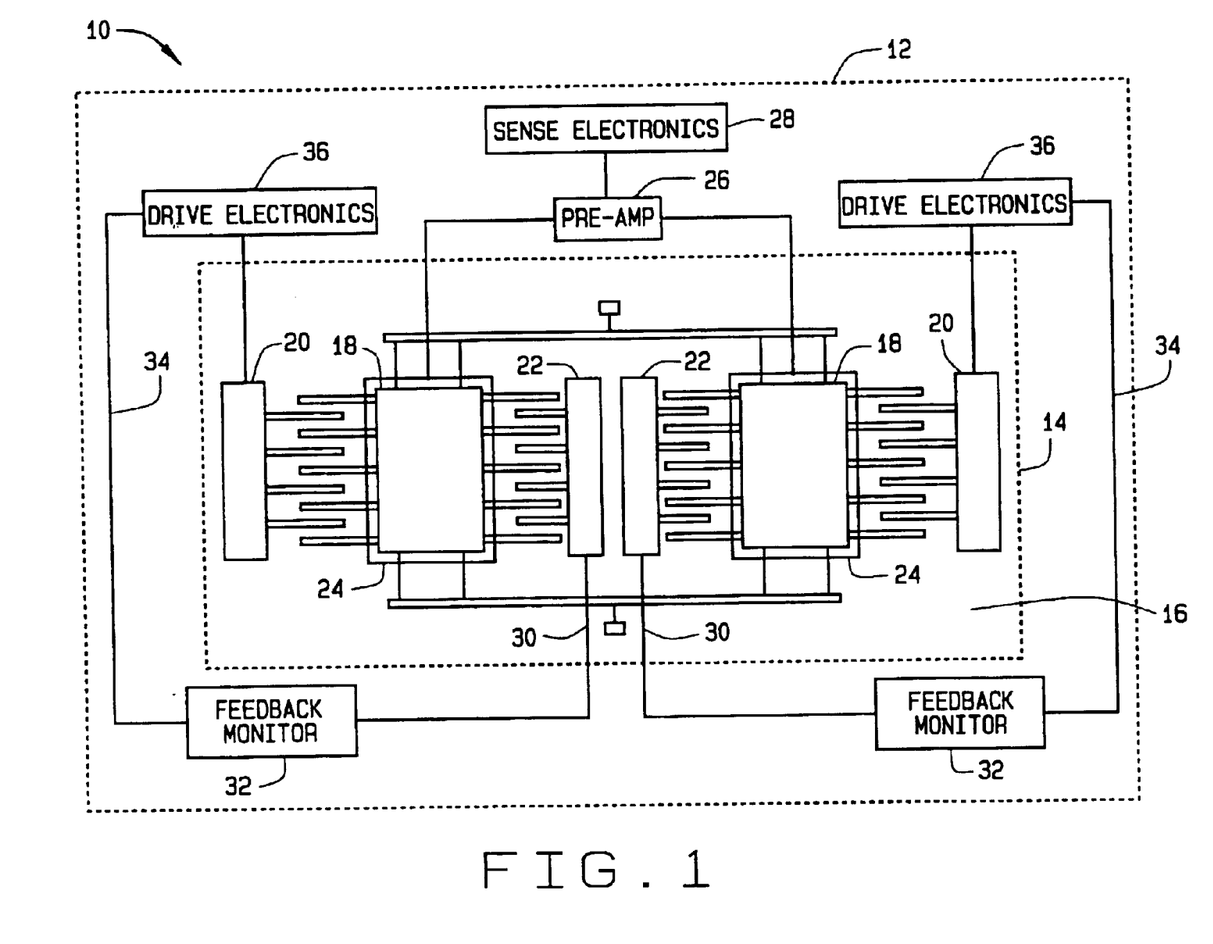
FIG. 1 is a schematic illustration of a MEMS gyroscope.

FIG. 1 is a schematic illustration of a micro electromechanical system (MEMS) gyroscope 10. MEMS gyroscope 10 may include a housing 12 that includes therein a tuning fork gyroscope (TFG) 14. Housing 12 may be a plastic package, a small outline integrated circuit (SOIC) package, a plastic leadless chip carrier (LCC) package, a quad flat package (QFP), or other housings as known in the art. Housing 12 may provide a structure to co-locate elements of TFG 14 and/or locate other elements within a close proximity of one another within the housing 12. TFG 14, in one embodiment, is located within a substantially sealed cavity 16 which is formed by bonding silicon to a glass substrate. Substantially sealed cavity 16 provides separation between sensitive elements of TFG 14 and drive electronics, described below.

In one embodiment, TFG 14 may include proof masses 18, motor drive combs 20, motor pickoff combs 22, and sense plates 24. A pre-amplifier 26 may be included within housing 12 and may be electrically connected or coupled to each proof mass 18 and sense plate 24 combination. Preanplifier 26 and TFG 14 may both be formed on a common substrate and, in one embodiment, may be electrically connected. In other embodiments, pre-amplifier 26 may be electrically connected to proof masses 24. An output of pre-amplifier 26 may be sent to sense electronics 28, or alternatively, pre-amplifier 26 may be incorporated within sense electronics 28. No matter which configuration is utilized, electrical connections between TFG 14 and one or both of pre-amplifier 26 and sense electronics 28 exist for gyroscope 10 to be functional.

In addition, an output 30 of motor pickoff combs 22 is transferred to feedback monitors 32. Feedback monitors 32 provide output signals 34 to drive electronics 36, which power motor drive combs 20. Alternatively, feedback monitors 32 may be incorporated within drive electronics 36. Again, connections to elements of TFG 14 are made to feedback monitors 32 and drive electronics 36 in order for gyroscope 10 to be functional. MEMS gyroscope 10 may also include a system power source and other operational electronics, which are not shown in FIG. 1 for ease of illustration.

Motor drive combs 20 excite the proof masses 18 using electrostatic forces by applying a voltage between drive combs 20 and interdigitated comb teeth of proof masses 18. Motor pickoff combs 22 monitor the excitation or oscillation of proof masses 18 by monitoring voltage signals on electrodes on proof masses 18. Motor pickoff combs 22 output a feedback signal to feedback monitors 32. Feedback monitor 32 provides an output 34 which is input to drive electronics 36. If proof masses 18 begin to oscillate too fast or too slow, drive electronics 36 may adjust an oscillation frequency such that proof masses 18 vibrate at a resonant frequency. Excitation at such a frequency may enable a higher amplitude output signal to be generated. Herein, pre-amplifier 26, sense electronics 28, feedback monitor 32, and drive electronics 36, may be referred to collectively as gyroscope electronics.

As illustrated in the Figure and described above, electrical connections are to be made between gyroscope electronics and sealed cavity 16 of TFG 14. Making such connections while maintaining a seal for cavity 16 has been shown to be difficult, as illustrated and described with respect to FIGS. 2 and 3.

Figure 2:
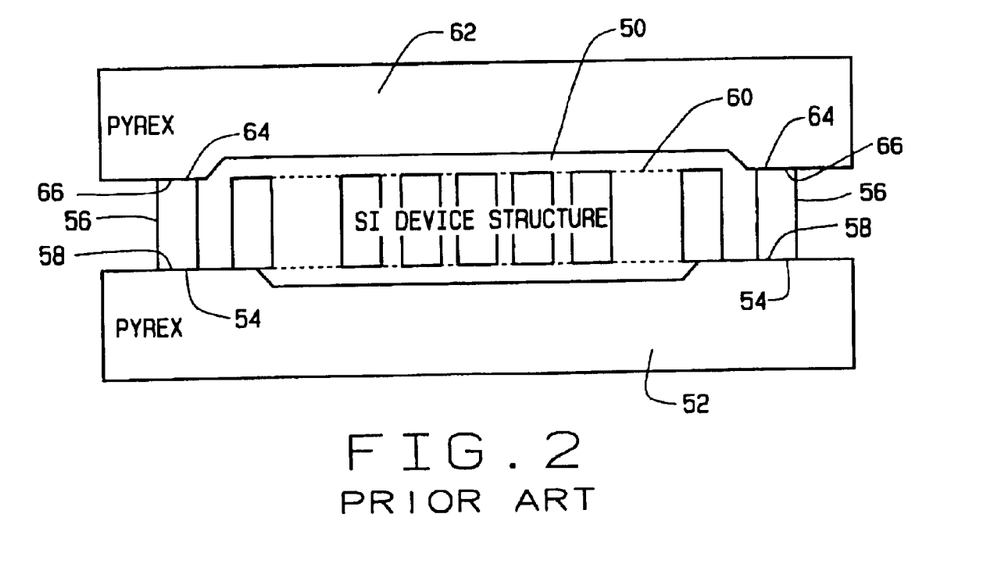
FIG. 2 illustrates a structure formed utilizing a method for making a hermetically sealed cavity using a silicon-glass MEMS process.

FIG. 2 is a cross-sectional view illustrating one known method for bonding silicon to a glass substrate in order to form a hermetically sealed cavity 50. A glass substrate 52 includes bonding surfaces 54 to which a sealing ring 56 also having bonding surfaces 58 is anodically bonded. Sealing ring 56 is, in the embodiment shown, a continuous seal ring that completely surrounds, but is not connected to, a second silicon structure 60. In one embodiment, sealing ring 56 is made of silicon. Silicon structure 60, for example, could be a vibrating sensor, including, but not limited to, tuning fork gyroscope 14 (shown in FIG. 1). A second glass substrate 62 having a bonding surface 64 is subsequently bonded to a bonding surface 66 of sealing ring 56, but not second silicon structure 60, thereby forming cavity 50. In an alternative embodiment, sealing ring 56 is first bonded to second glass substrate 62. While referred to as a ring, sealing ring 56 is understood to include any and all shapes which could be utilized to form a cavity as needed for specific applications.

Figure 3:
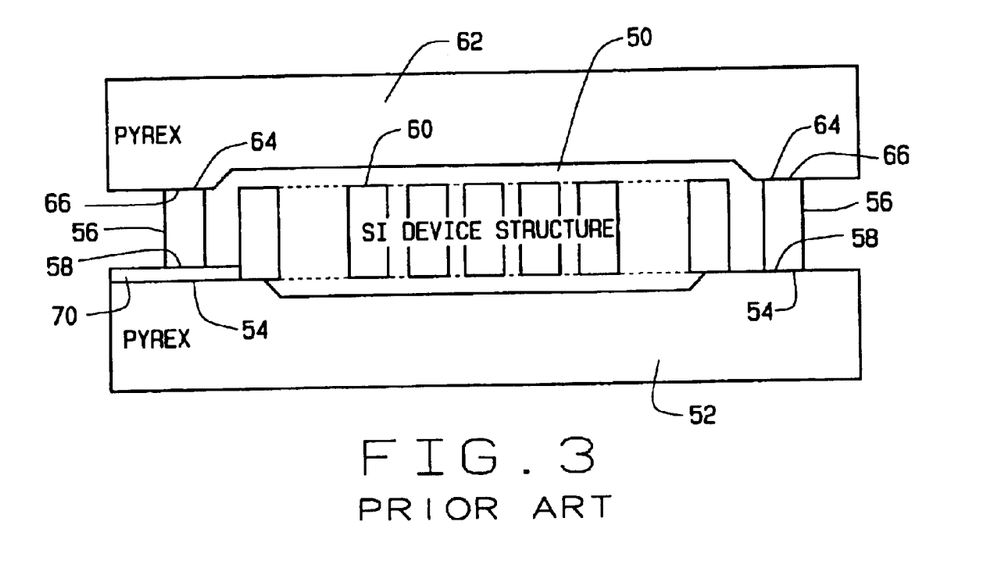
FIG. 3 illustrates a structure where an electrical lead is passed into a hermetically sealed cavity formed using the silicon-glass MEMS process.

FIG. 3 illustrates the structure described with respect to FIG. 2, but with an addition of an electrical lead 70 from within cavity 50 to a position outside of cavity 50. Components in FIG. 3 common with those in FIG. 2 are identified using the same reference numbers. An electrical lead 70 is placed on glass substrate 52 to provide an electrical connection between silicon structure 60 and a circuit (not shown) outside of cavity 50. Although a single lead 70 is shown, it is understood that embodiments exist where multiple leads 70 are needed between silicon structure 60 and the circuit outside of cavity 50, for example between a tuning fork gyroscope 14 (shown in FIG. 1) and gyroscope electronics. FIG. 3 further illustrates that when electrical leads 70 are utilized, at least a portion of bonding surfaces 54 of glass substrate 52 and at least a portion of bonding surfaces 58 of sealing ring 56 no longer make contact. Further, since bonding surfaces 54 and 58 are substantially flat, areas of bonding surface 58 exist which do not make contact with bonding surface 54, making it difficult to maintain hermetically sealed cavity 50. In other words, routing electrical leads 70 between bonding surfaces 54 and 58 can cause the hermetic seal to be compromised, as portions of bonding surfaces 54 and 58 are separated from one another due to the presence of electrical leads 70.

Figure 4:
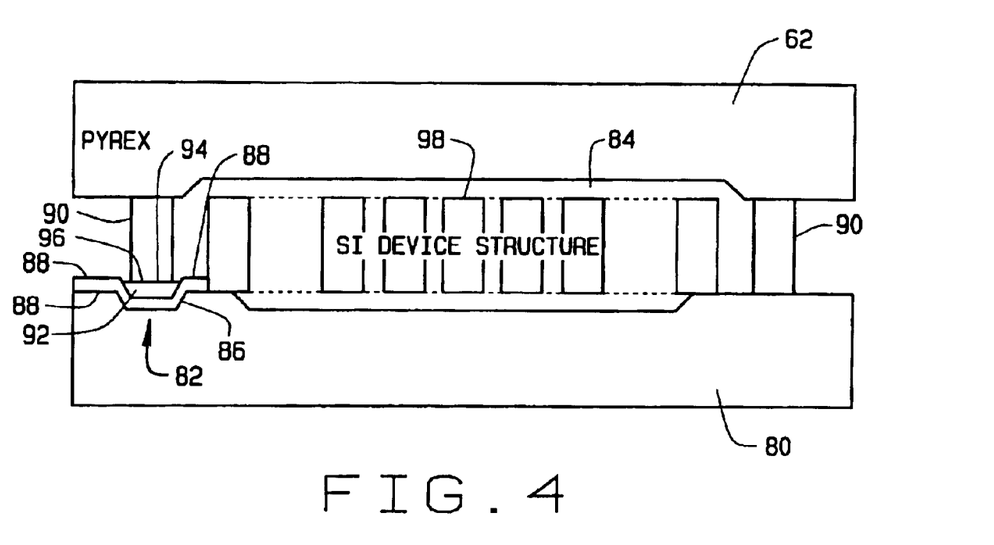
FIG. 4 illustrates an improved method for passing an electrical lead into a hermetically sealed cavity formed using the silicon-glass MEMS process.

FIG. 4 illustrates an improved structure for passing an electrical signal into a hermetically sealed cavity formed at least in part through a silicon-glass MEMS process. The embodiment illustrated in FIG. 4 utilizes a modified glass substrate 80 where at least one recess 82 is formed into glass substrate 80 where it is desired to pass an electrical signal into hermetically sealed cavity 84. An electrical lead 86 is formed within recess 82 and extending on an upper surface 88 of substrate 80. In one embodiment, electrical lead 86 is conductive and fabricated from metal.

Lead 86 is constructed such that extending portions 88 extend into cavity 84 and to an area outside where sealing ring 90 is to be placed, for connection to an electrical circuit. In one embodiment, sealing ring 90 is made from silicon. A glass deposit 92 is placed within recess 82 and on top of lead 86 according to methods described further with respect to FIG. 5. Glass deposit 92 provides a bonding surface 94 for sealing ring 90. The described embodiment therefore solves the sealing problems described above, by essentially creating an electrical path underneath a surface of glass substrate 80. Further, a substantially flat surface 94 is provided for bonding with a surface 96 of sealing ring 90 and creating a hermetic seal for cavity 84, which may be necessary for operation of silicon structure 98.

It should be noted that the structure described in FIG. 4 may be fabricated in multiple ways. For example, silicon structure 98 may be fabricated from a silicon wafer (not shown) that is disposed upon glass substrate 80, while sealing ring 90 is fabricated from a silicon wafer (not shown) that is disposed on second glass substrate 62. By placing second glass substrate 62, with sealing ring 90, onto glass substrate 80 (and glass deposits 92 in relevant locations, the sealed cavity 84 is formed. Alternatively, sealing ring 90 may be formed on glass substrate 80 while silicon structure 98 is formed on second glass substrate 62. Also, sealing ring 90 and silicon structure 98 can be formed from a single silicon wafer (not shown) that is disposed on either glass substrate 80 or second glass substrate 62. Whichever method is utilized, the result is that at least a portion of sealing ring is fabricated to form a seal with glass deposit 92 and a portion of sealing ring 90 is fabricated to form a seal with a portion of glass substrate 80.

FIG. 5 illustrates a process for providing electrical signals into a cavity, while maintaining a hermetic seal around the cavity, similar to the structure illustrated in FIG. 4. Referring to FIG. 5A, a glass substrate 100 has at least one recess 102 formed on a surface 104 of substrate 100. In specific embodiments, recesses 102 are etched in glass substrate 100 everywhere that an electrical feedthrough for an electrical signal is needed. As shown in FIG. 5B, conductive leads 106 are deposited and patterned in and around recesses 102. FIG. 5C illustrates a glass layer 108 that has been deposited over the entire surface 104 of substrate 100. Glass layer 108 covers both recesses 102 and conductive leads 106.

Figure 5A:
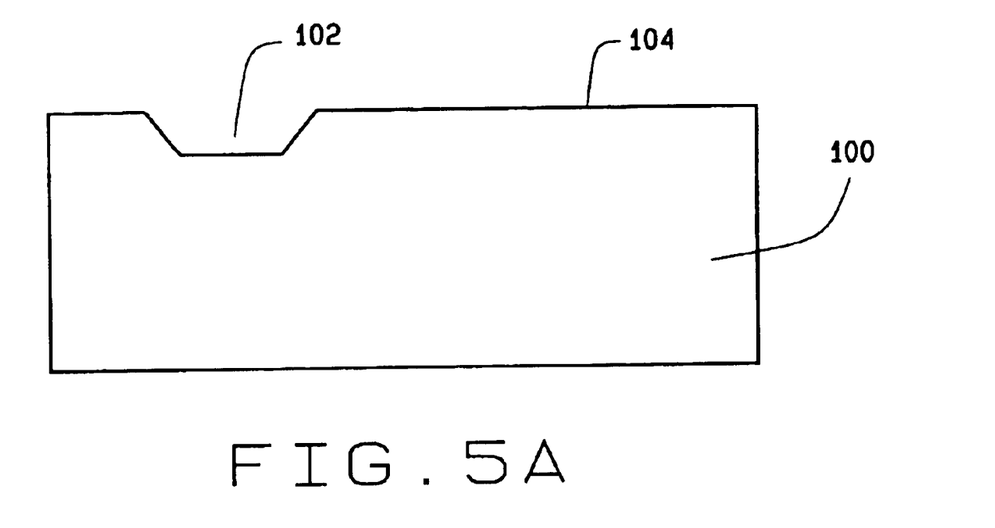
FIG. 5 is a step-by-step illustration of the method of FIG. 4.
Figure 5B:
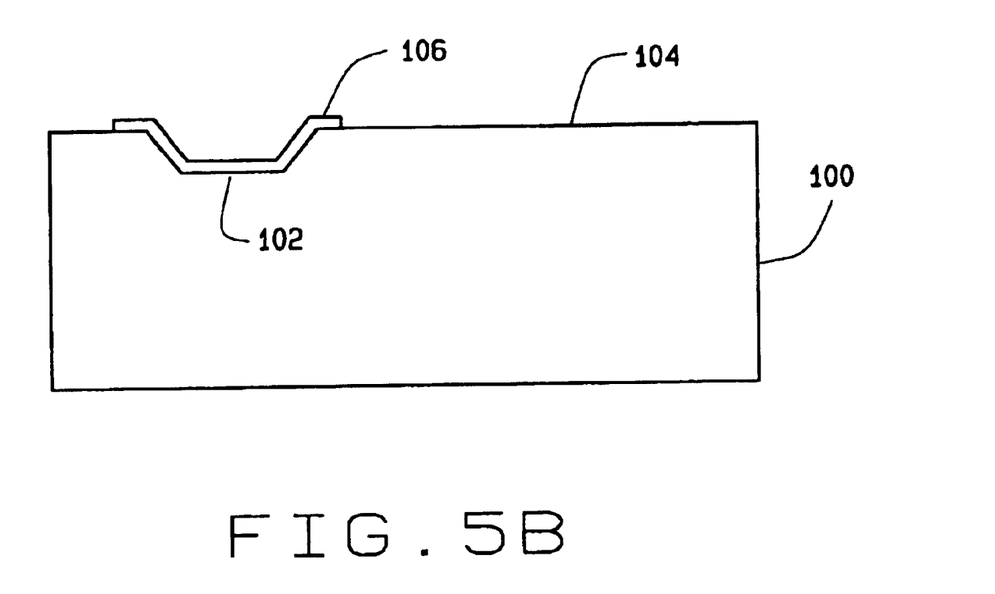
Figure 5C:
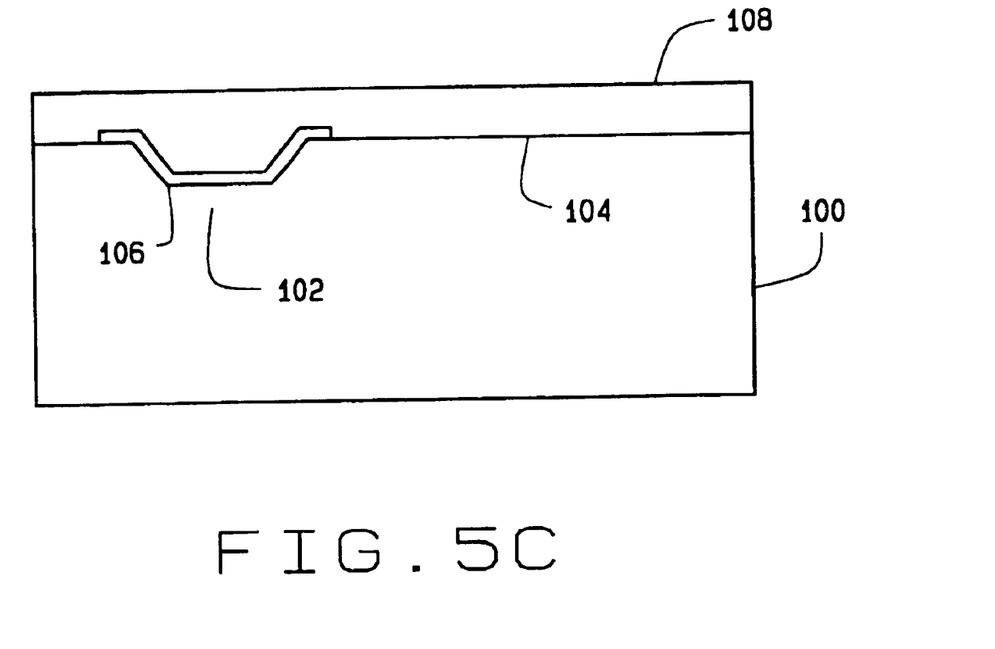
Figure 5D:
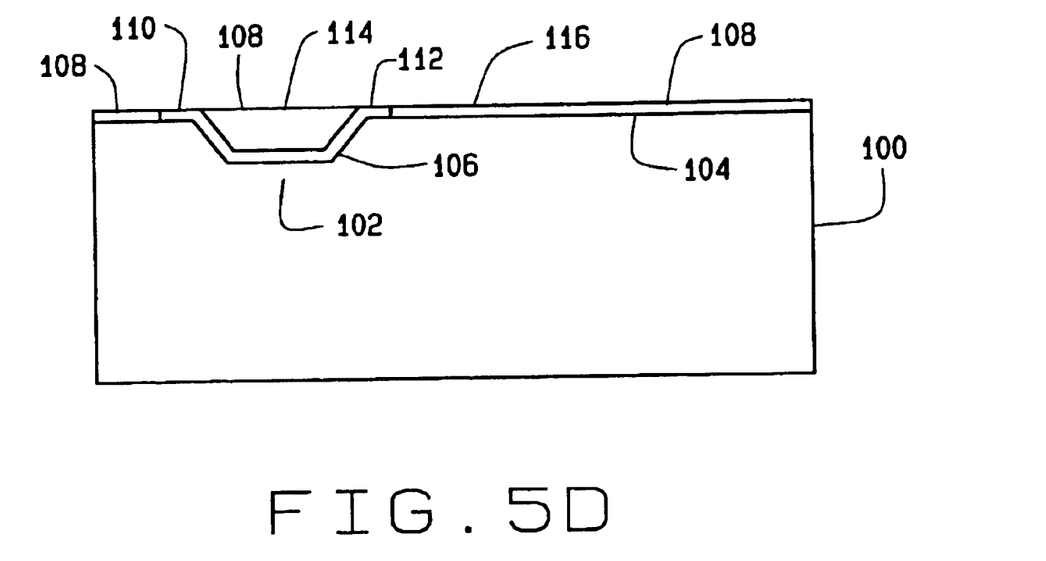

Referring to FIG. 5D, glass layer 108 is then planarized, utilizing chemical-mechanical polishing or other techniques, to a level where a first contact 110 and a second contact 112 of leads 106 are exposed. This process leaves a conductive lead 106 within recess 102, which is substantially covered by glass layer 108 and providing a surface 114 that is essentially planar with a surrounding glass surface 116.

In another embodiment, glass layer 108 is planarized to a first level, then the planarized glass layer is etched to a level where first contact 110 and second contact 112 of leads 106 are exposed.

Figure 5E:
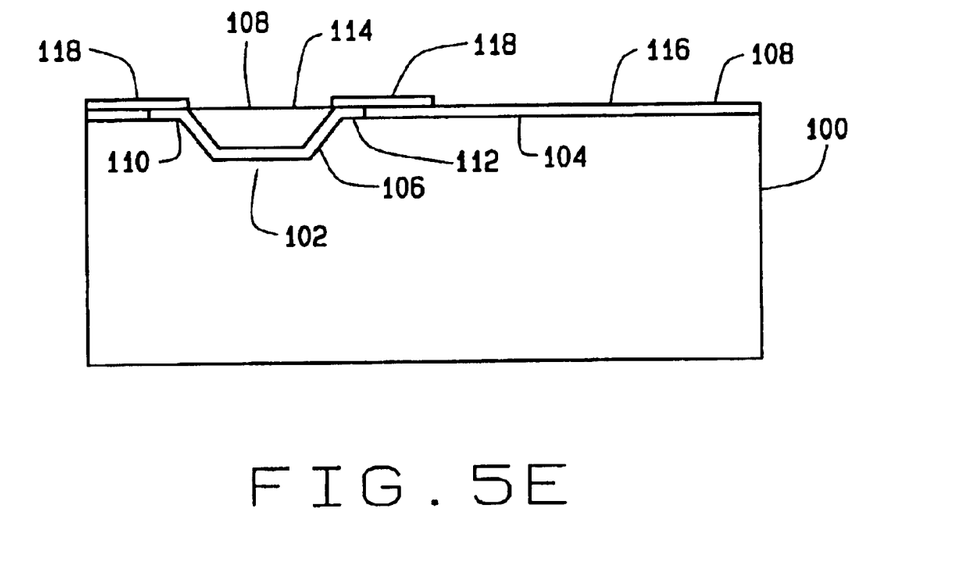
Figure 5F:
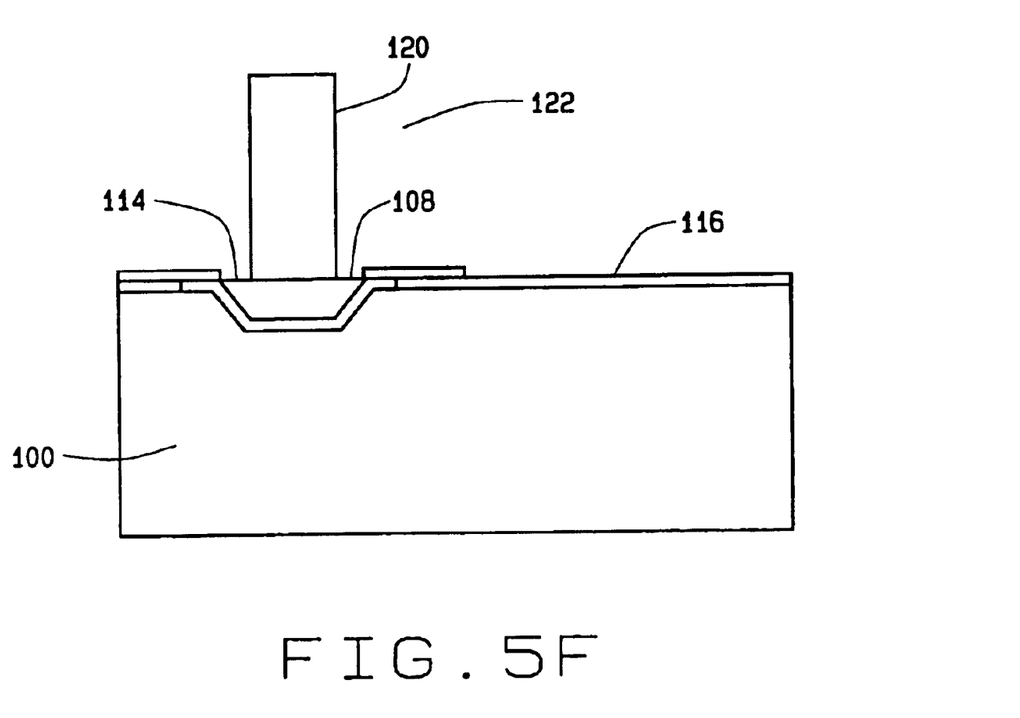

As shown in FIG. 5E, electrical contacts 118, for example, to electrical circuits (not shown) can be attached to first contact 110 and second contact 112 of electrical leads 106 since they are now exposed. Referring to FIG. 5F, a silicon wafer 120 is then bonded to planarized substrate surfaces 114 and 116 (bonding to surface 116 not shown) such that electrical leads 106 go under silicon wafer 120, but do not cause a loss of a hermetic seal between silicon wafer 120 and glass substrate 100 (glass layer 108). Electrical leads 106 are functionally and structurally equivalent to electrical leads 86 (shown in FIG. 4).

Figure 6:
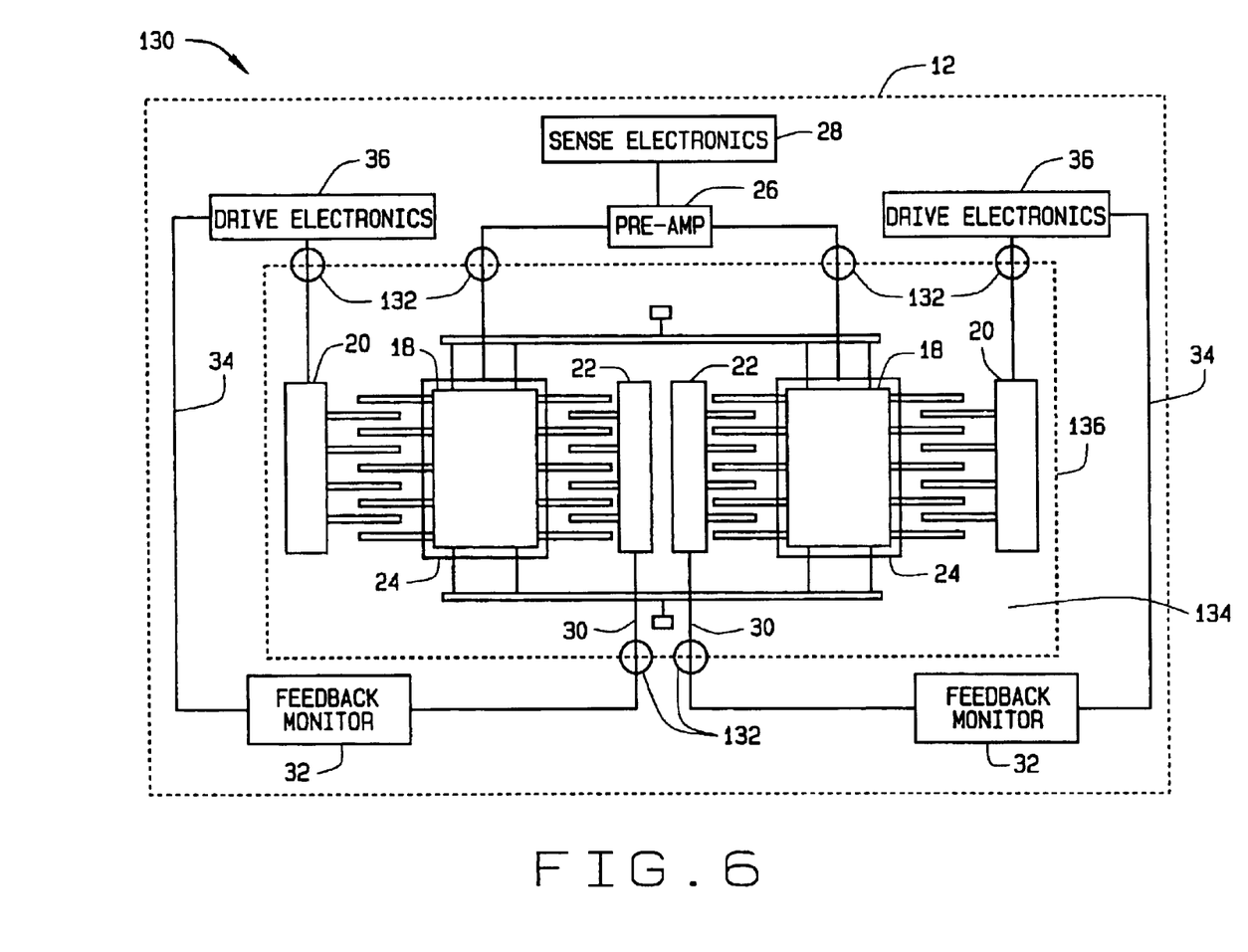
FIG. 6 is a functional illustration of a MEMS gyroscope which shows areas where the electrical feedthroughs of FIG. 4 are utilized.

FIG. 6 is a schematic illustration of a MEMS gyroscope 130 which utilizes electrical feedthroughs 132 from a hermetically sealed cavity 134. Hermetically sealed cavity 134 provides an operating environment for tuning fork gyroscope (TFG) 136. Electrical feedthroughs 132 are provided through utilization of electrical leads 86 (shown in FIG. 4). TFG 136 for the purposes herein may be considered to be one embodiment of silicon structure 98 (shown in FIG. 4). Substantially sealed cavity 134 provides separation between sensitive elements of TFG 136 and drive electronics. Pre-amplifier 26 and TFG 136, feedback monitor 32 and TFG 136, and drive electronics 36 and TFG 136 may be electrically connected utilizing electrical leads 86. In other configurations, similar to those described with respect to FIG. 1, electrical leads 86 provide the electrical connections between TFG 136 and gyroscope electronics.

Figure 7:
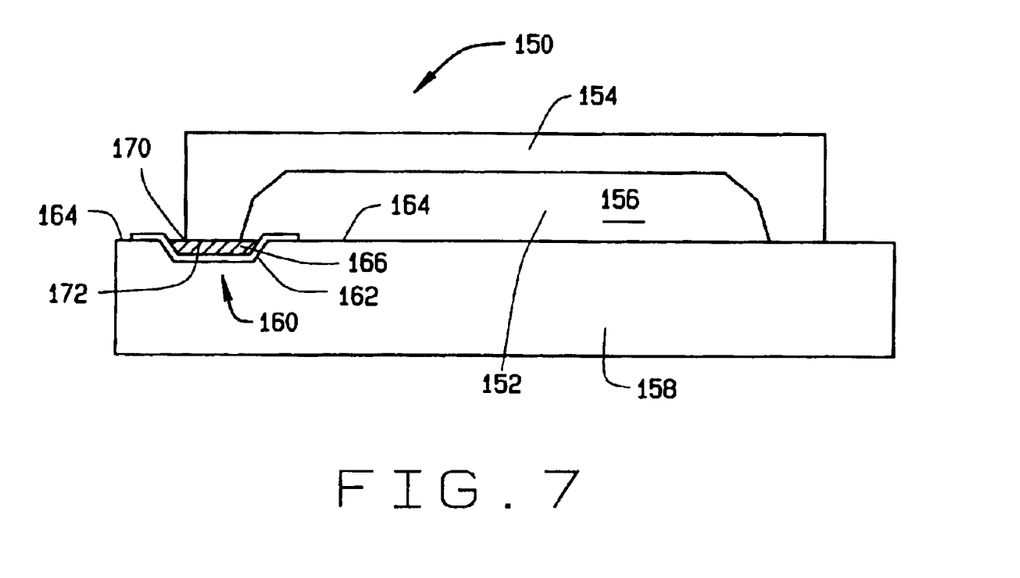
FIG. 7 illustrates an alternative embodiment of a structure which provides electrical leads into a hermetically sealed cavity.

FIG. 7 illustrates an alternative structure 150 for providing a hermetically sealed cavity 152 utilizing a silicon-glass MEMS process. In structure 150, rather than a sealing ring and a second glass substrate (as shown in FIG. 4), a silicon device 154 with a recess 156 formed therein is utilized to form cavity 152. To form cavity 152, a glass substrate 158 is bonded to silicon device 154.

To provide an electrical path underneath a surface of glass substrate 158, glass substrate 158 includes a recess 160 formed into glass substrate 158 where it is desired to pass an electrical signal into hermetically sealed cavity 152. An electrical lead 162, in one embodiment a conductive lead, is formed within recess 160 and extends onto an upper surface 164 of substrate 158. A glass deposit 166 is placed within recess 160 and on top of lead 168 utilizing the processes described above. Glass deposit 166 provides a bonding surface 170 for bonding with bonding surface 172 of silicon structure 154, and therefore allows construction of hermetically sealed cavity 152.

Figure 8:
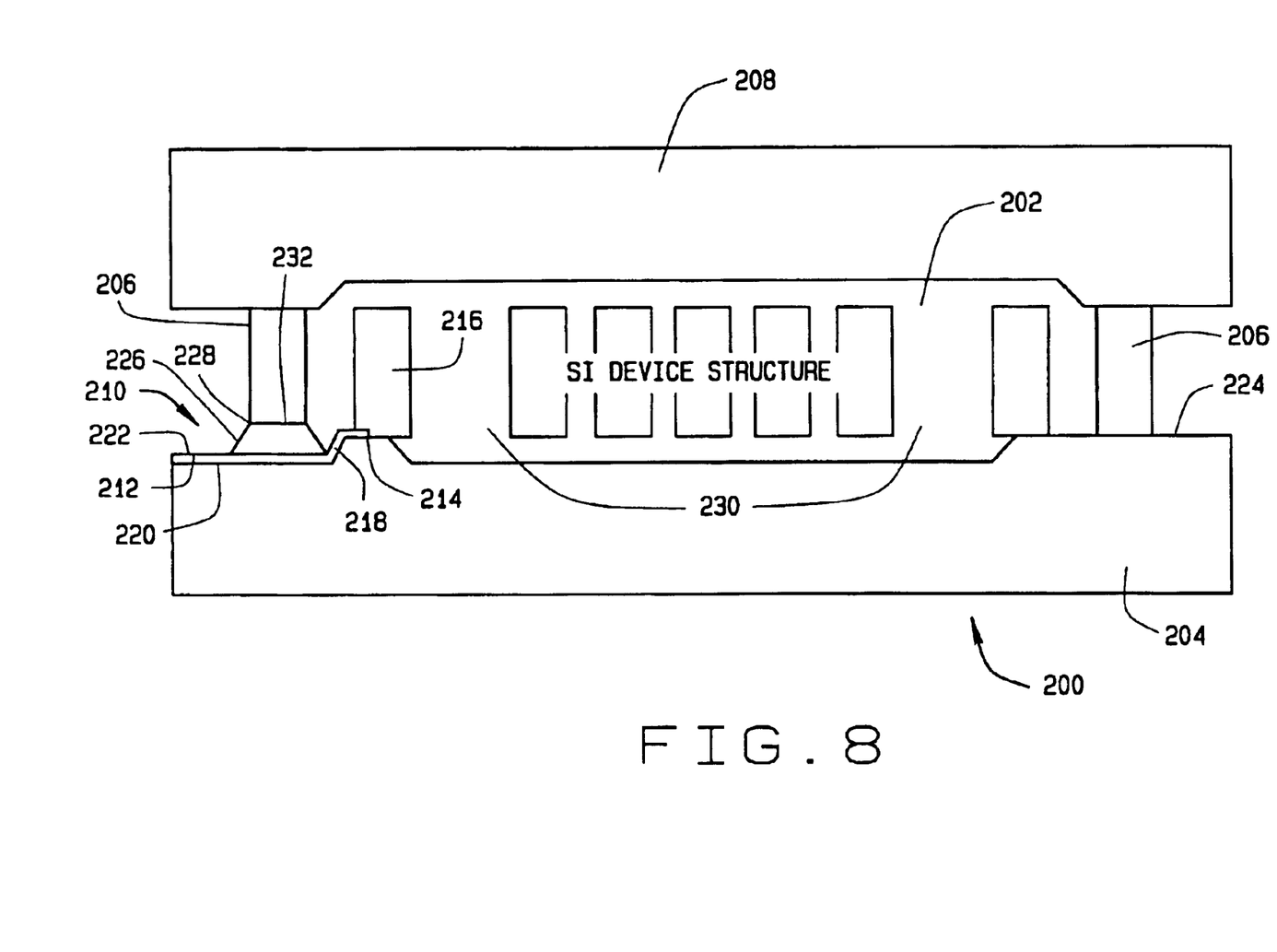
FIG. 8 illustrates an alternative embodiment of a structure which provides electrical leads into a hermetically sealed cavity.

FIG. 8 illustrates an alternative embodiment (in cross-section) of a structure 200 for providing a hermetically sealed cavity 202 utilizing a silicon-glass MEMS process. In structure 200, a modified glass substrate 204 is utilized in forming cavity 202 along with a sealing ring 206 that is, or will be, attached to glass substrate 208. At least one recess 210 is formed into glass substrate 204 where it is desired to pass an electrical signal into hermetically sealed cavity 202. An electrical lead 212 is formed on recess 210 and extending to an upper surface 214 of substrate 204, for connection to a device 216. In one embodiment, electrical lead 212 is conductive and fabricated from metal. In one embodiment, sealing ring 206 is made from silicon.

Lead 212 is constructed such that portion 218 extends into cavity 202 for connection to device 216, and portion 220 extends to an area outside of where sealing ring 206 is eventually placed, for connection to an electrical circuit (not shown). As an upper surface 222 of electrical lead 212 is within recess 210, upper surface 222 is below an upper surface 224 of substrate 204, making hermetic sealing with sealing ring difficult. To alleviate such sealing difficulty, a glass deposit 226 is deposited on upper surface 222 of electrical lead 212, within recess 210. Glass deposit 226 is planarized such that an upper surface 228 is formed which is at a same level as upper surface 224 of substrate 204. Upper surface 228 of glass deposit 226 is eventually bonded to sealing ring 206 to form sealed cavity 202, to allow proper operation of silicon structure 230. The described embodiment therefore solves the sealing problems described above, by essentially creating an electrical path underneath glass deposit 226. Further, a substantially flat surface (upper surface 228) is provided for bonding with a surface 232 of sealing ring 206 and creating a hermetic seal for cavity 202, which may be necessary for operation of silicon structure 230.

Although not illustrated, it is contemplated that devices, for example, MEMS pressure sensors, resonators, and temperature sensors, are to be constructed utilizing the structures illustrated in FIGS. 7 and 8. It is further intended that any differences between the structures of FIGS. 4, 7, and 8 show only different manufacturing embodiments for MEMS devices. Further, other devices are contemplated which utilize electrical feedthroughs as shown and described with respect to FIGS. 4, 7, and 8, including, but not limited to, accelerometers, pressure sensing devices, and other MEMS devices.

The above described embodiments for providing electrical feedthroughs into a substantially sealed cavity are improvements over known methods of sealing such cavities which utilize electrical feedthroughs. The known methods involved attempting to seal over an uneven topology which included both electrical feedthroughs and a glass surface, as described with respect to FIG. 3. The result has been unbonded areas which break the hermetic seal, due to the uneven surface.

The above described embodiments provide electrical feedthroughs into a hermetically sealed cavity. However, it is contemplated that the methods and structures described herein extend to applications other than those which involve passage of electrical conductors into and out of sealed cavities. For example, the electrical feed throughs described may also be utilized to provide electrical connections between portions of a silicon structure that is fabricated from a patterned silicon wafer. More specific examples would be electrical connections between portions of silicon structure 98 (shown in FIG. 4) and between portion of silicon structure 230 (shown in FIG. 8). Such methodology extends to providing electrical connections between any electrical components that can be disposed or mounted on glass substrates.

The herein described methods involve utilization of feedthroughs which are essentially embedded underneath a smooth glass surface, allowing a much better seal between silicon and glass. Therefore, while the invention has been described in terms of various specific embodiments, those skilled in the art will recognize that the invention can be practiced with modification within the spirit and scope of the claims.

What is claimed is:

1. A structure having a hermetically sealed cavity therein, said structure having at least one electrically conductive path passing from outside of the sealed cavity to inside the sealed cavity, said structure comprising:

a glass substrate comprising recesses formed therein where electrical signals are to pass into the sealed cavity;

conductive leads deposited in and around said recesses;

a glass layer deposited over said substrate, said glass layer further deposited over said recesses and said conductive leads, said glass layer planarized to a level of a portion of said conductive leads around said recesses; and silicon bonded to said planarized glass layer to form a cavity, said silicon fabricated such that a portion of each said conductive lead is within the sealed cavity and a portion of each said conductive lead is outside the sealed cavity.

2. A structure according to claim 1 wherein said recesses comprise etched recesses.

3. A structure according to claim 1 wherein said glass layer is planarized using a chemical-mechanical polishing process.

4. A structure according to claim 1 wherein said silicon comprises a sealing ring bonded to said planarized glass layer, said sealing ring configured to be bonded to a second glass substrate.

5. A structure according to claim 1 wherein said silicon comprises a micro-electromechanical structure (MEMS).

6. A structure according to claim 5 wherein said structure comprises at least one of a MEMS gyroscope and a MEMS accelerometer.

7. A micro electromechanical system (MEMS) gyroscope comprising:

a housing;

gyroscope electronics located within said housing;

a structure defining a hermetically sealed cavity within said housing; and a tuning fork gyroscope located within the hermetically sealed cavity, said structure comprising:

a plurality of electrical feedthroughs providing electrical connections between said gyroscope electronics and said tuning fork gyroscope;

a glass substrate comprising recesses formed therein, said recesses being where said electrical feedthroughs pass into and out of the hermetically sealed cavity;

a glass layer deposited over said substrate, said glass layer further deposited over said electrical feedthroughs in said recesses, said glass layer planarized to a level of a portion of said electrical feedthroughs around said recesses; and silicon bonded to said planarized glass layer, said silicon fabricated such that a portion of each said electrical feedthrough is within the hermetically sealed cavity and a portion of each said electrical feedthrough is outside the hermetically sealed cavity.

8. A MEMS gyroscope according to claim 7 wherein said recesses comprise etched recesses.

9. A MEMS gyroscope according to claim 7 wherein said glass layer is planarized using a chemical-mechanical polishing process.

10. A MEMS gyroscope according to claim 7 wherein said silicon wafer comprises a sealing ring bonded to said planarized glass layer, said sealing ring configured to be bonded to a second glass substrate.

11. A structure having a hermetically sealed cavity therein, said structure having at least one electrically conductive path passing from outside of the cavity to the sealed cavity, said structure comprising:

a glass substrate comprising recesses formed therein where electrical signals are to pass into the sealed cavity and an upper surface;

conductive leads deposited on said recesses;

a glass deposit on said conductive leads, said glass deposit comprising an upper surface planarized to a level of said upper surface of said substrate; and silicon bonded to said upper surface of said glass deposit and said upper surface of said substrate, said silicon fabricated such that a portion of each said conductive lead is within the sealed cavity and a portion of each said conductive lead is outside the sealed cavity.

* * * * *

UNITED STATES PATENT AND TRADEMARK OFFICE
CERTIFICATE OF CORRECTION

PATENT NO.     : 6,888,233 B2                                        Page 1 of 1
DATED          : May 3, 2005
INVENTOR(S)    : Horning et al.

It is certified that error appears in the above-identified patent and that said Letters Patent is hereby corrected as shown below:

Column 5,
Line 67, after "locations" insert -- ) --.

Column 8,
Line 6, delete "feed throughs" and insert therefor -- feedthroughs --.

Signed and Sealed this

Twenty-ninth Day of November, 2005

JON W. DUDAS
*Director of the United States Patent and Trademark Office*